United States Patent
Yamaguchi et al.

(10) Patent No.: US 6,365,969 B1
(45) Date of Patent: Apr. 2, 2002

(54) OHMIC ELECTRODE, METHOD OF MANUFACTURING THE SAME AND SEMICONDUCTOR DEVICE

(75) Inventors: Akira Yamaguchi, Itami; Masanori Murakami, Kyotanabe; Hirokuni Asamizu, Kyoto, all of (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/526,382

(22) Filed: Mar. 16, 2000

(30) Foreign Application Priority Data

Mar. 25, 1999 (JP) .............................. 11-080974

(51) Int. Cl.$^7$ .................... H01L 23/48; H01L 23/52; H01L 29/40
(52) U.S. Cl. ........................ 257/745; 257/744
(58) Field of Search ................. 257/744, 746, 257/745

(56) References Cited

U.S. PATENT DOCUMENTS

| | | | |
|---|---|---|---|
| 4,610,932 A | * | 9/1986 | Haynes et al. |
| 4,673,593 A | * | 6/1987 | Himoto |
| 5,015,603 A | | 5/1991 | Boos et al. |
| 5,726,462 A | * | 3/1998 | Spahn et al. |

FOREIGN PATENT DOCUMENTS

| | | |
|---|---|---|
| EP | 0442203 | 8/1991 |
| JP | 54152485 | 11/1979 |
| JP | 58141529 | 8/1983 |
| JP | 62060218 | 3/1987 |
| JP | 03016176 | 1/1991 |
| JP | 5-81048 | 11/1993 |
| JP | 11-220119 | * 8/1999 |
| JP | 11220119 | 8/1999 |
| JP | 2000-277455 | * 10/2000 |
| WO | WO88/00392 | 1/1988 |

OTHER PUBLICATIONS

"Interfacial Microstructures of Au/Zn/Au Ohmic Contacts to p–type InP", Akira Yamaguchi et al. Sumitomo Denki, No. 141, Sep. 1992, pp. 100–104.
"Pd/Zn/PD/Au Ohmic Contacts to p–Type InP", D.G.Ivey et al., Journal of Electron Materials, vol. 20, No. 3, Mar., 1991, pp. 237–246.
"Antimony Passivation of inP", Hajime Nobusawa et al., Jpn J.Appl.Phys., vol. 32, Part 1, No. 9A, Sep. 1993, pp. 3713–3719.
"Formation of ohmis contacts to n–GaAs using $(NH_4)_2S$ surface passivation", V. Fischer et al., J. Vac. Sci. Technol. B, vol. 12, No. 3, May/Jun., 1994, pp. 1419–1421.
"GePd (Zn) Ohmic contact scheme on p–InP based on the solid phase regrowth principle", L. C. Wang et al., Appl. Phys. Lett., vol. 66, No. 24, Jun. 12, 1995, pp. 3310–3312.
"Low resistance Ohmic contact scheme ($\sim\mu\Omega cm^2$) to p–InP", Moon–Ho Park et al., Appl. Phys.Lett., vol. 70, No. 1, Jan. 6, 1997, pp. 99–101.

* cited by examiner

Primary Examiner—Sheila V. Clark
(74) Attorney, Agent, or Firm—W. F. Fasse; W. G. Fasse

(57) ABSTRACT

An ohmic electrode consists of a plurality of metal layers stacked on a p-type group III–V semiconductor crystal base material, in which a layer consisting of a group VB metal is stacked as a first layer as viewed from the side of the base material and a second layer containing Zn, for example, a third layer consisting of a refractory metal and a fourth layer consisting of Au are successively stacked on the first layer. Thus, a thin reaction layer can be formed by performing heating at a low temperature of not more than 400° C. simultaneously with formation of a p-type semiconductor electrode, for obtaining a metal electrode structure of a p-type group III–V semiconductor having an excellent ohmic characteristic.

20 Claims, 3 Drawing Sheets

FIG. 3A
FIG. 3B
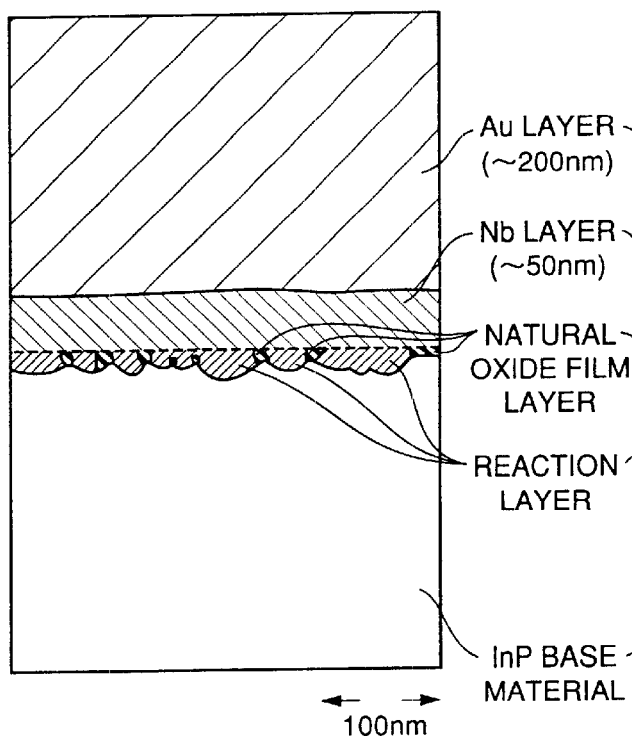
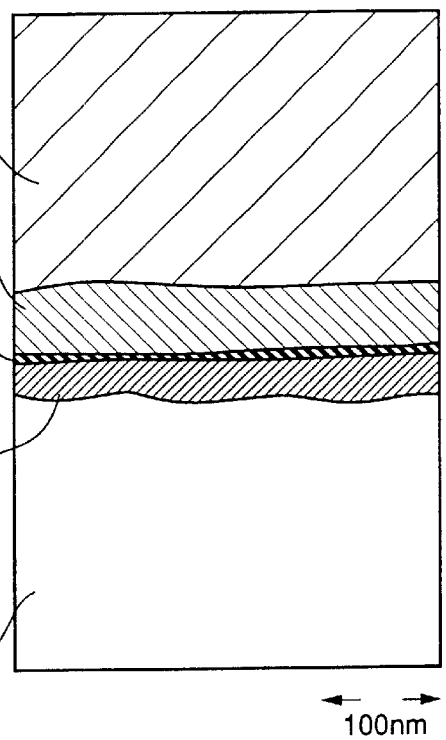
FIG. 4
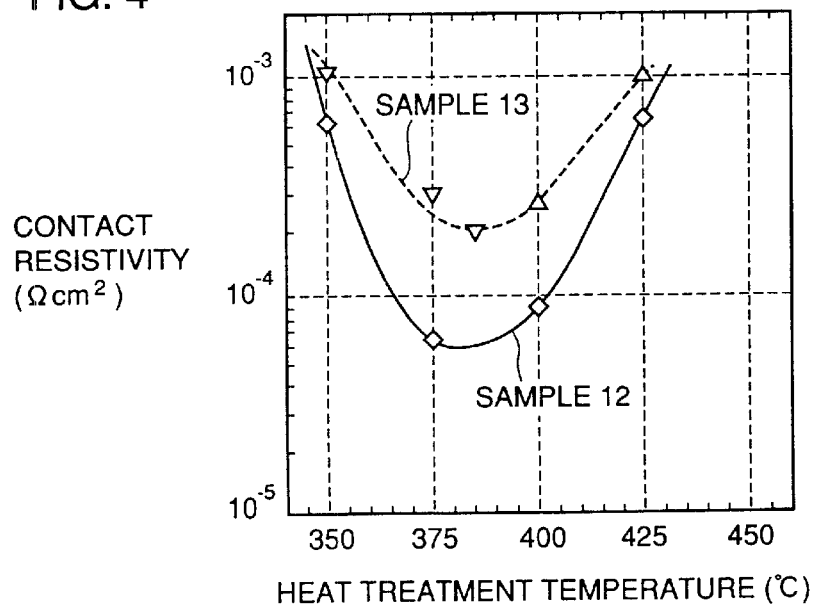

OHMIC ELECTRODE, METHOD OF MANUFACTURING THE SAME AND SEMICONDUCTOR DEVICE

BACKGROUND OF THE INVENTION

1. Field of the Invention

The present invention relates to an ohmic electrode, suitable to a semiconductor device, having a base material of a p-type group III–V (group 3B–5B) semiconductor, particularly a p-type InP based semiconductor, and a semiconductor device employing the electrode.

2. Description of the Prior Art

In general, a multilayer electrode consisting of Au—Zn metals is employed as an ohmic electrode (hereinafter also referred to simply as an electrode) for semiconductor devices such as a photodiode, a laser diode or a light emitting diode, for example, having a base material of a p-type group III–V semiconductor, particularly an InP based semiconductor. In this electrode, Au is employed for the following reason:

After depositing an Au—Zn metal film, heat treatment is performed in the temperature range of 400 to 450° C. At this time, Au reacts with the InP based semiconductor base material and diffuses into the base material through a native oxide film present on the surface thereof. Consequently, electrical contact is attained between the base material and the Au metal film.

In order to attain electrical contact between the base material and the metal film as described above, a metal reacting with the base material and thermally diffusing in a high temperature range, as described above must be selected as the material forming the metal film. In the electrode, further, Zn is employed for the following reason:

Zn diffuses into the base material due to the aforementioned heating, to form a p-type doped layer of high concentration on the surface of the base material. Thus, holes can tunnel through a Schottky barrier defined on the interface between the metal film and the base material after deposition of the metal film. Consequently, Zn serves as a p-type impurity carrier for the base material.

If the metal film consists of only Au, the surface of the base material will have a low p-type carrier concentration (concentration of about $10^{18}$ cm$^{-3}$ in general) although electrical contact between the metal and the base material is attained as described above. Thus, an ohmic electrical contact resistivity (hereinafter simply referred to as contact resistivity) characteristic is not obtained on the contact interface between the metal film and the base material. Therefore, Zn which is a p-type impurity must diffuse into the surface of the base material for improving the carrier concentration on this surface.

Attempts of providing Au/Zn/Au metal electrodes on p-type InP based semiconductor base materials for reducing contact resistivity on the interfaces therebetween are presented in some literature. Sumitomo Denki, No. 141 (September 1992), pp. 100 to 104 presents an exemplary electrode employing an impurity-free InP based semiconductor crystal for a base material. This electrode is formed by depositing fourth and fifth layers consisting of Ti/Au on first to third layers having controlled thicknesses and thereafter alloying the layers by heating the same in a nitrogen atmosphere at a temperature of 435° C. However, this electrode has such a problem that protrusions of the alloyed layers (hereinafter referred to as reaction layers) on the surface of the base material reach an operating layer of a semiconductor device, to result in a failure of the semiconductor device.

For example, *J. Electron. Mater.*, Vol. 20 (1991), p. 237 presents an electrode having a shallow reaction layer and small contact resistivity obtained by additionally stacking a Pd layer on the same system metal layers. Further, *Appl. Phys. Lett.*, Vol. 66 (1995), p. 3310 describes an electrode having a shallow reaction layer and small contact resistivity obtained by forming Ge/Pd/Zn/Pd metal layers, and *Appl. Phys. Lett.*, Vol. 70 (1997), p. 99 describes an electrode having a shallow reaction layer and small contact resistivity obtained by forming Pd/Sb/Zn/Pd metal layers.

Each of these electrodes requires heat treatment at a high temperature exceeding 400° C. In general, however, a p-type electrode and an n-type electrode are simultaneously arranged in the same semiconductor base material wafer, and when heating an Au/Ge/Ni metal film widely employed as the n-type electrode at such a high temperature, for example, the components of this film diffuse into the base material and deeply infiltrate into the base material wafer to disadvantageously deteriorate the essential practical characteristics of the wafer. While an Au layer is provided as the uppermost layer in order to suppress sheet resistance of a part connected to an external device and improve bondability of a connection wire (increase connection strength), diffusion of Au may abnormally progress to deteriorate the characteristics of the semiconductor wafer if the heating temperature in film formation exceeds 400° C. To this end, Japanese Patent Laying-Open No. 3-16176 (1991), for example, describes an attempt providing a stopper layer consisting of Ti or Cr between an Au/Zn/Au electrode and an uppermost layer of Au for suppressing excess diffusion of Au. Also in this case, however, the electrode must be heated at a high temperature of 430 to 450° C.

In order to reduce the heating temperature, transition metals must be employed for the electrode as already proposed by the inventors in Japanese Patent Application No. 10-18843 (1998), for example. The transition metals react with an oxide film formed on the surface of a base material at a lower temperature as compared with Au. When employing these metals, reaction generally progresses at a low temperature of not more than 400° C. As a result, an electrode having a low contact resistance value is obtained. Further, the aforementioned problem in the case of simultaneously arranging a p-type electrode and an n-type electrode can also be solved. In order to perform heat treatment at a relatively low temperature as described above, reactivity between the oxide film provided on the semiconductor base material and the transition metals employed for the electrode is important.

In order to bear no relation to the oxide film provided on the surface of the base material, the oxide film is previously removed in general. In this case, the oxide film is removed by chemical etching, for example, and thereafter sputtering is performed with an ion beam or plasma in a vacuum chamber, for example. Each of Japanese Patent Laying-Open Nos. 62-60218 (1987) and 58-141529 (1983) presents a method applying a molecular beam of Sb or the like onto a compound semiconductor base material for removing an oxide film from the surface of the compound semiconductor base material. In the method of removing the oxide film by chemical etching, an oxide film of about several nm is formed on the surface of the base material exposed to the atmosphere after removal of the oxide film, and hence application of a molecular beam is required in any case. However, the method employing sputtering with an ion beam or plasma is undesirable since charged particles damage the surface of the base material to deteriorate the electric characteristics thereof. Such influence by the charged particles is remarkable particularly when the reaction layer has a small thickness. A similar problem arises also in the Pd/Zn/Pd electrode proposed by the inventors in Japanese Patent Application No. 10-18843. In other words, it is important to control the thickness, the composition etc. of a native oxide film formed on the surface of the base material.

In *J. Vac. Sci. Technology,* Vol.12, No. 3 (1994), p. 1419, Fischer et al. propose a method of preventing oxidation of the surface of the base material after etching. According to this proposal, the base material is dipped in an ammonium solution so that the surface chemically adsorbs sulfur (S) atoms, thereby preventing the surface from oxidation. However, the inventors have confirmed that this method is insufficient for preventing oxidation since an S atom layer is unstable. Further, the solution generates hydrogen sulfide gas or precipitates powder of a polysulfide, leading to a possibility of contaminating the peripheral environment.

Japanese Patent Publication No. 5-81048 (1993) presents an ohmic electrode having a small forbidden bandwidth provided with an alloyed layer consisting of a mixed crystal prepared by depositing, when a layer containing Al is present on an InP base material, for example, a first layer consisting of only Sb and a second layer containing Au on this layer and thereafter performing heat treatment at 450° C. for three minutes thereby reacting the layers. Also in this method, however, the heat treatment temperature is so high that the reaction layer is deepened and the performance of the base material wafer may be deteriorated in a device also employing the aforementioned n-type semiconductor electrode.

In the aforementioned prior art, therefore, the composition and the structure of the oxide film present on the surface of the semiconductor base material cannot be controlled while forming a thin reaction layer by heating at a low temperature of not more than 400° C. simultaneously with formation of the electrode, and it is difficult to control contact resistance of the ohmic electrode and the heat treatment temperature. Thus, an electrode having an excellent ohmic characteristic cannot be obtained.

SUMMARY OF THE INVENTION

An object of the present invention is to control the composition and the structure of an oxide film provided on a surface of a semiconductor base material and reduce contact resistance by reducing a heat treatment temperature.

An ohmic electrode according to the present invention consists of a plurality of metal layers stacked on a p-type group III–V semiconductor crystal base material (hereinafter simply referred to as a base material). A first layer as viewed from the side of the base material consists of a group VB (group 5B) element, and a second layer and subsequent layers are successively stacked on the first layer.

The first layer preferably contains at least one element particularly selected from a group of Sb, Bi and As as the group VB element, and the thickness of the first layer is preferably in the range of 2 to 10 nm. The second layer preferably contains Zn, and preferably consists of Zn and a transition metal. Further, a third layer consisting of a refractory metal and a fourth layer consisting of Au are preferably stacked on the second layer. Preferable thicknesses of the third and fourth layers are 20 to 200 nm and 100 to 500 nm respectively. In particular, a base material consisting of a group III–V semiconductor crystal of either InP or $Ga_xIn_{1-x}As_yP_{1-y}$, where x and y represent zero or positive numbers less than 1 and y represents a number satisfying y=1–2.1x, can be selected as a preferable base material.

A method of manufacturing an ohmic electrode according to the present invention includes steps of first depositing a first layer consisting of a group VB element on a substrate consisting of a p-type group III–V semiconductor crystal and successively depositing a second layer and subsequent layers on the first layer thereby forming a laminate consisting of a plurality of metal layers and heat-treating the laminate in the temperature range of 300 to 400° C.

The present invention also includes a method of implementing the aforementioned various preferable modes when depositing each layer on the base material. Further, the present invention also includes a semiconductor device having the aforementioned ohmic electrode.

The foregoing and other objects, features, aspects and advantages of the present invention will become more apparent from the following be detailed description of the present invention when taken in conjunction with the accompanying drawings.

BRIEF DESCRIPTION OF THE DRAWINGS

FIGS. 3A and 3B typically illustrate the structures of the ohmic electrodes according to the inventive sample No. 1 and the comparative sample No. 2;

FIG. 4 illustrates the relations between heat treatment temperatures and contact resistivity values of ohmic electrodes according to an inventive sample No. 12 and a comparative sample No. 13.

DESCRIPTION OF THE PREFERRED EMBODIMENTS

Figure 1A:
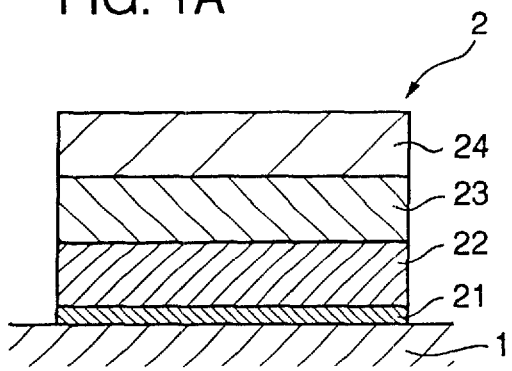
FIGS. 1A and 1B typically illustrate sections of p-type ohmic electrodes according to Example and comparative example.

The present invention provides an ohmic electrode consisting of a metal multilayer structure stacked on a base material of a p-type InP based semiconductor crystal, for example. The base material is prepared from either InP or a p-type semiconductor crystal consisting of a mixed crystal composition of InP and another group III–V semiconductor, for example. The latter (mixed crystal composition) may be any substance so far as the same is within the above range, while a substance having a composition expressed in a chemical formula $Ga_xIn_{1-x}As_yP_{1-y}$, where x and y represent zero or positive numbers less than 1 and y represents a number satisfying y=1–2.1x, which is a mixed crystal of InP and GaAs is particularly employed as the base material in general.

The metal multilayer structure provided on the base material includes a layer consisting of a group VB element as a first layer as viewed from the side of the base material. The metallic element of the group VB forming the first layer reacts with a native oxide film provided on the surface of the base material at a temperature of not more than 400° C., to reduce/remove the native oxide film. This action is reported by Nobusawa et al. in Jpn. J. Appl. Physics, Vol. 32 (1993), p. 3713, for example. According to this report, a layer of antimony (Sb) having a thickness of 4 nm is formed on the surface of an n-type InP base material employed in a Schottky diode and thereafter heat treatment is performed at 300° C. for 10 minutes thereby oxidizing Sb itself and consequently reducing an oxide of indium (In) formed on the surface of the base material, in order to improve the state of the Schottky diode having a low barrier and a large leak current. Thus, Sb readily reacts with an indium oxide formed on the surface of an InP base material.

The thickness of the first layer is preferably 2 to 10 nm. In general, therefore, this layer is distributed in the form of islands without covering the overall surface of the base material. This layer prompts breakage of the oxide film formed on the surface of the base material, so that Zn contained in a second layer diffuses into the surface of the base material through the broken portion to improve the carrier concentration on the surface. Thus, excellent ohmic contact with the base material is attained. If the thickness of the first layer is less than 2 nm, Zn contained in the second layer having a low sticking coefficient with respect to the InP surface hardly sticks to the surface of the base material and the aforementioned effect is hard to attain. If the thickness of the first layer exceeds 10 nm, Zn or a transition metal contained in the second layer is inhibited from diffusing into the base material and the carrier concentration on the surface of the base material may not be sufficiently increased. At least one of Sb, Bi and As can be preferably employed for the first layer in particular.

The second layer provided on the first layer can be prepared from various transition metal elements or noble metal components, while the same is preferably prepared from a metal including Zn. Zn readily diffuses into the base material, and is particularly suitable for doping the surface of the base material with p-type carriers of high concentration and prompting formation of an ohmic electrode having a low contact resistivity value. In addition to Zn, Mg and Be, transition metal elements such as Cd and Mn can be employed for the second layer, for example. Pd, Co, Pt, Rh, Ni, Au, Ag and Ir can be preferably exemplified as the transition metal elements, for example. A material containing Zn and these metals may be employed for the second layer.

According to the inventive ohmic electrode, the aforementioned first and second metal layers are successively stacked and the thickness of each layer is particularly preferably controlled in the aforementioned range, so that the aforementioned functions of the first and second layers are combined with each other to enable provision of a p-type metal electrode by heat treatment at a temperature of not more than 400° C. simultaneously with provision of an n-type metal electrode while enabling provision of an unprecedentedly practical metal electrode of a p-type InP based semiconductor having contact resistivity at the level of $10^{-5}$ $\Omega cm^2$ with a reaction layer of not more than 0.1 $\mu m$ in thickness.

The ohmic electrode provided by the present invention also includes that formed by successively arranging a third layer consisting of a refractory metal and a fourth layer consisting of Au on the second layer in the aforementioned structure consisting of the first and second metal layers. Nb, W, Mo, Ta, Ti, Pt or the like can be exemplified as the refractory metal forming the third layer. In this case, the third layer of the refractory metal avoids contact between Au contained in the uppermost layer provided thereon and the second layer containing Zn thereby preventing mutual diffusion of Au and the metal contained in the second layer in heat treatment. The thickness of the third layer is preferably 20 to 200 nm. If the thickness of the third layer is less than 20 nm, mutual diffusion of Au contained in the fourth layer and the metal contained in the second layer is hard to suppress. If the thickness of the third layer exceeds 200 nm, the thickness of the overall electrode is so increased that pattern releasability in a lift off method generally employed for fine working is deteriorated and the efficiency of vapor deposition tends to lower. The uppermost Au layer reduces the sheet resistance of the electrode and improves wire bondability, and the thickness of this layer is preferably controlled in the range of 100 to 500 nm so that the Au layer sufficiently serves these functions.

According to the present invention, the aforementioned third and fourth layers are successively additionally stacked on the first and second layers and the thicknesses of the added layers are particularly preferably controlled in the aforementioned ranges, thereby enabling provision of a p-type metal electrode by heat treatment at a temperature of not more than 400° C. simultaneously with provision of an n-type metal electrode and enabling provision of an unprecedentedly excellent metal electrode of a p-type InP based semiconductor having low sheet resistance and excellent wire bondability with contact resistivity of less than $10^{-4}$ $\Omega cm^2$ and a reaction layer of not more than 0.1 $\mu m$ in thickness due to combination of the functions of the aforementioned layers.

A method of manufacturing an ohmic electrode according to the present invention is now described in detail. In order to manufacture the inventive ohmic electrode, a base material consisting of a p-type group III–V semiconductor crystal such as an InP based semiconductor crystal, for example, is first prepared. A preferable p-type group III–V semiconductor base material other than the InP based semiconductor is as described above. Then, a layer consisting of a group VB metal is deposited as a first layer as viewed from the side of the base material. A second layer and subsequent metal layers are successively deposited on the first layer. Zn and/or the aforementioned metal, for example, other than Zn is deposited as the second layer and the aforementioned metals, for example, are deposited as third and fourth layers respectively. While the layers are successively deposited one by one from the first layer in consideration of control of the thicknesses of the respective layers, any method is employable so far as the same is an existing thin film forming method. While a method such as vacuum vapor deposition, sputtering or ion plating, for example, is applicable, the layers are preferably deposited one by one by vacuum vapor deposition in general. As raw materials forming the sources for the metal layers, metal wires or metal particles are employed when depositing the layers by resistance heating or particles or mattes such as rods or ingots are employed when depositing the layers by electron beam deposition. The purity of each metal is preferably at least 3 N.

Thereafter heat treatment is performed at a temperature in the range of 300 to 400° C. This heat treatment is performed in a non-oxidizing gas atmosphere or a low-pressure atmosphere containing non-oxidizing gas, in order to prevent oxidation of the deposited metal layers and the base material. Inert gas such as argon, nitrogen or helium or reducing gas such as hydrogen or the like is generally employed as the atmosphere gas. The pressure of the atmosphere gas is preferably in the range of $10^{-2}$ Torr to the atmospheric pressure. Influence may be exerted by external contamination of oxygen if the pressure is less than $10^{-2}$ Torr and airtightness of a container is insufficient, while the pressure resistance of the container must be increased if the pressure exceeds the atmospheric pressure, leading to a possibility of increasing the manufacturing cost. The atmosphere is preferably prepared by a method temporarily forming a vacuum state of up to about $10^{-3}$ Torr and thereafter introducing prescribed atmosphere gas under prescribed pressure, in order to prevent oxidation of the deposited metal layers and the base material. The (heat treatment) time holding the temperature in the aforementioned range may be about 30 seconds to 10 minutes in general.

EXAMPLE 1

Figure 1B:
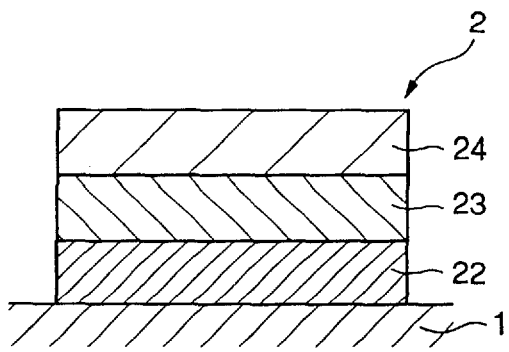

The basic structure of a representative ohmic electrode prepared in Example 1 of the present invention is described with reference to FIGS. 1A and 1B. FIGS. 1A and 1B are model diagrams showing sections of ohmic electrodes 2 according to Example 1 and comparative example respectively. The ohmic electrodes 2 are provided on base materials 1 consisting of p-type InP based semiconductor crystals. The electrode 2 of Example 1 is formed by a first layer 21 consisting of a group VB metal, a second layer 22 consisting of Zn, a third layer 23 consisting of a refractory metal Nb and a fourth layer 24 consisting of Au. The electrode 2 of comparative example, having no first layer, is formed by a second layer 22 consisting of Au directly provided on the base material 1 and third and fourth layers 23 and 24 identical to those of Example 1.

Each of inventive and comparative samples Nos. 1 and 2 was prepared as follows: An InP based semiconductor crystal having carrier concentration of $2 \times 10^{18}$ cm$^{-3}$, a length of 9 mm, a width of 18 mm and a thickness 0.4 mm was prepared as the base material 1. Further, Sb of 99.95% in purity, Zn of 99.999% in purity, Nb and Au were prepared as the sources for the first to fourth layers 21 to 24. The base material 1 was arranged in a vacuum vapor deposition apparatus. In the inventive sample No. 1, the first layer 21 was deposited from the Sb source in a thickness of 5 nm, the second layer 22 was deposited by successively stacking a layer of 5 nm in thickness from the Zn source and another layer of 10 nm in thickness from the Au source, the third layer 23 was deposited in a thickness of 50 nm from the Nb source and the fourth layer 24 was deposited in a thickness of 200 nm from the Au source respectively. In the comparative sample No. 2, the second, third and fourth layers 22, 23 and 24 were deposited similarly to those of the sample No. 1 without depositing the first layer 21. Then, these laminates were heat-treated for two minutes in a nitrogen atmosphere containing 5% of hydrogen gas while adjusting the gas pressure so that the total pressure was 1 atm. The treatment temperature was set in the range of 250 to 500° C. Contact resistivity values of the obtained electrodes were measured by a transmission line model method. Table 1 shows the values measured at various treatment temperatures.

Figure 2:
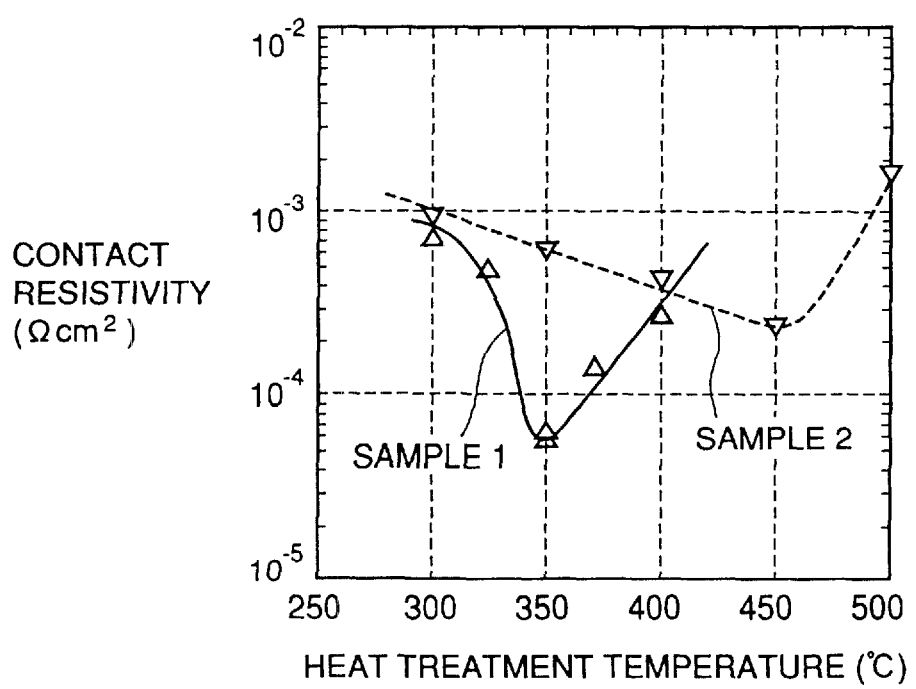
FIG. 2 illustrates the relations between heat treatment temperatures and contact resistivity values of ohmic electrodes according to an inventive sample No. 1 and a comparative sample No. 2.

FIG. 2 illustrates the relations between these data and the heat treatment temperatures. Referring to FIG. 2, it is understood that contact resistivity is minimized to $5 \times 10^{-5}$ $\Omega \text{cm}^2$ by heat treatment at 350° C. in the inventive sample No.1 while contact resistivity of the comparative sample No.2 is minimized by heat treatment at 450° C., higher than that in the inventive sample No. 1 by 100° C., and the minimum value $22 \times 10^{-5}$ $\Omega \text{cm}^2$ is about four times the minimum value of the inventive sample No. 1. Thus, it is understandable that the effect attained by forming the first layer of the present invention is remarkable.

TABLE 1

| Sample No. | Contact Resistivity ($\times 10^{-5} \Omega \text{cm}^2$) Treatment Temperature (° C.) | | | | | | | |
|---|---|---|---|---|---|---|---|---|
| | 250 | 300 | 325 | 350 | 375 | 400 | 450 | 500 |
| 1 | 160 | 70 | 50 | 5 | 13 | 28 | 180 | — |
| *2 | 180 | 98 | — | 60 | — | 40 | 22 | 180 |

*: comparative sample

FIGS. 3A and 3B typically show enlarged sections of the inventive sample No. 1 and the comparative sample No. 2 at the minimum contact resistivity values respectively. Referring to each of FIGS. 3A and 3B, the lowermost layer is the base material, the part shown by thin oblique lines is a reaction layer, the part shown by thick oblique lines is a native oxide film layer where an originally existing native oxide film remains, the part on this layer is an Nb layer, and the uppermost layer is an Au layer. The reaction layer of the inventive sample No. 1 has a uniform thickness and is scattered in depths of 20 to 30 nm with the maximum depth of less than 0.1 μm. It is understood that the reaction layer of the comparative sample No. 2 has depths of 30 to 50 nm although the thickness thereof is uniform, and is larger than that of the inventive sample No. 1. While the native oxide film layer (black part in FIG. 3B) remains on the reaction layer in the comparative sample No. 2, the native oxide film layer partially disappears in the inventive sample No. 1, to back up the effect of the present invention.

The same base material as that of the inventive sample No. 1 was employed for providing the aforementioned p-type deposition layers while providing an n-type AuGeNi deposition layer on another part of the base material, and these layers were simultaneously heat-treated in the same atmosphere as the above at 350° C. In this case, a normal n-type reaction layer was obtained with a uniform thickness substantially identical to that of the aforementioned p-type reaction layer and contact resistivity at the level of $10^{-5}$ $\Omega \text{cm}^2$. When an ohmic electrode was prepared under the same conditions of metal layer deposition and heat treatment as those for the inventive sample No. 1 except that the base material was prepared from Ga$_{0.15}$In$_{0.85}$As$_{0.33}$P$_{0.67}$ (x=0.15, y=0.33), i.e., a mixed crystal composition of InP and GaAs, in place of InP, to obtain evaluation results substantially identical to those of the inventive sample No. 1.

Then, each of samples Nos. 3 to 11 was prepared by depositing a first layer and a second layer on a base material similar to the above from sources consisting of metals substantially identical to those in the inventive sample No. 1 with metal species and thicknesses shown in Table 2 respectively. In each of the samples Nos. 10 and 11, the second layer was prepared by depositing a lower layer of Zn and an upper layer of Ni or Co in thicknesses of 5 nm. Thereafter the obtained laminate was heat-treated under atmosphere conditions similar to those for the inventive sample No. 1 at 350° C. for two minutes. Table 2 shows contact resistivity values and situations of reaction layers of the respective samples. Mark □ in "Uniformity of Thickness" indicates that no protrusion at least 0.1 μm in maximum depth is present on a section of each sample. It is understood from the results shown in Table 2 that the thickness of the first layer is preferably in the range of 2 to 10 nm.

TABLE 2

| Sample No. | First Layer Species | Thickness (nm) | Second Layer Species | Thickness (nm) | Reaction Layer Thickness (nm) | Uniformity of Thickness | Contact Resistivity ($\times 10^{-5} \Omega cm^2$) |
|---|---|---|---|---|---|---|---|
| 3 | Sb | 2 | Zn | 10 | 0.05 | ☐ | 10.5 |
| 4 | Sb | 2 | Zn | 10 | 0.05 | ☐ | 7.0 |
| 5 | Sb | 5 | Zn | 10 | 0.05 | ☐ | 5.0 |
| 6 | Sb | 10 | Zn | 10 | 0.05 | ☐ | 9.0 |
| 7 | Sb | 12 | Zn | 10 | 0.05 | ☐ | 13.0 |
| 8 | Bi | 5 | Zn | 10 | 0.05 | ☐ | 6.5 |
| 9 | As | 5 | Zn | 10 | 0.05 | ☐ | 6.5 |
| 10 | Sb | 5 | Zn + Ni | 10 | 0.05 | ☐ | 6.5 |
| 11 | Sb | 5 | Zn + Co | 10 | 0.05 | ☐ | 7.0 |

EXAMPLE 2

A base material similar to that in Example 1, the same Sb and Zn sources as those in Example 1 and a new electrode source of Pd having purity of 99.999% were prepared. A first layer of Sb was deposited in a thickness of 3 nm on the base material in a procedure similar to that in Example 1, for preparing an inventive sample No. 12. A comparative sample No.13 was prepared by depositing Pd in place of Sb. A layer of Zn having a thickness of 10 nm and a layer of Pd having a thickness of 20 nm were successively deposited on each of the samples Nos. 12 and 13, and the obtained laminate was heat-treated in the temperature range of 350 to 425° C. for two minutes. Table 3 and FIG. 4 show results of evaluation of the two types of electrodes prepared in the aforementioned manner. Also from the results shown in Table 3 and FIG. 4, it is understood that the inventive electrode prepared by depositing the first layer is remarkably excellent.

TABLE 3

| Sample | Contact Resistivity ($\times 10^{-5} \Omega cm^2$) Treatment Temperature (° C.) | | | | |
|---|---|---|---|---|---|
| No. | 350 | 375 | 385 | 400 | 425 |
| 12 | 105 | 30 | 20 | 30 | 110 |
| *13 | 60 | 7 | 6 | 9 | 65 |

*:comparative sample

The same base material as that of the inventive sample No. 12 was employed for providing the aforementioned p-type deposition layers while providing an n-type AuGeNi deposition layer on another part of the base material, and these layers were simultaneously heat-treated in the same atmosphere as the above at 375° C. In this case, a normal n-type reaction layer was obtained with a uniform thickness substantially identical to that of the p-type reaction layer and contact resistivity at the level of $10^{-6}$ $\Omega cm^2$. When an ohmic electrode was prepared under the same conditions of metal layer deposition and heat treatment as those for the inventive sample No. 12 except that the base material was prepared from $Ga_{0.15}In_{0.85}As_{0.33}P_{0.67}$ (x=0.15, y=0.33), i.e., a mixed crystal composition of InP and GaAs, in place of InP, to obtain evaluation results substantially identical to those of the inventive sample No. 12.

EXAMPLE 3

Each of samples Nos. 14 to 28 was prepared by depositing first and second layers on the same base material as that in the inventive sample No. 1. First, the first layer of Sb having a thickness of 3 nm and the second layer, consisting of a Zn layer of 5 nm in thickness and an Au layer of 10 nm in thickness, were deposited on the base material. Thereafter a third layer and a fourth layer were deposited on the second layer with metal species and thicknesses shown in Table 4. The obtained laminate was heat-treated under the same conditions as those for the inventive sample No. 1 in Example 1. Sources employed for the third and fourth layers were at least 99.995% in purity.

The situation of the reaction layer of the obtained electrode was substantially identical to that of the inventive sample No. 1 in each sample. Table 4 shows results of evaluation of contact resistivity and wire bondability. The wire bondability was confirmed by a method mounting an Au wire of 20 μm in diameter on the outer surface of the uppermost Au layer by thermal welding, fixing the base material and pulling the wire in a direction perpendicular to the outermost surface of the electrode. As a result, it was confirmed that each sample can withstand a tensile load exceeding a practical level of 2 g. It is understood that an ohmic electrode having small sheet resistance and particularly excellent wire bondability can be obtained by controlling the thicknesses of the third and fourth layers in the ranges of 20 to 200 nm and 100 to 500 nm respectively. Referring to "Wire Bondability" in Table 4, mark ○ indicates electrodes not separated up to a load exceeding 4 g, and marks ☐ and Δ indicate electrodes separated with loads of at least 3 g and less than 4 g and at least 2 g and less than 3 g respectively.

TABLE 4

| Sample No. | Third Layer Species | Thickness (nm) | Fourth Layer Species | Thickness (nm) | Sheet Resistance (Ω) | Wire Bondability |
|---|---|---|---|---|---|---|
| 14 | Nb | 50 | Au | 100 | 0.20 | ○ |
| 15 | Nb | 18 | Au | 150 | 0.15 | Δ |
| 16 | Nb | 20 | Au | 150 | 0.15 | ○ |
| 17 | Nb | 100 | Au | 150 | 0.14 | ○ |
| 18 | Nb | 200 | Au | 150 | 0.14 | ○ |
| 19 | Nb | 220 | Au | 150 | 0.13 | ☐ |
| 20 | Nb | 100 | Au | 90 | 0.22 | Δ |
| 21 | Nb | 100 | Au | 100 | 0.20 | ○ |
| 22 | Nb | 100 | Au | 350 | 0.10 | ○ |
| 23 | Nb | 100 | Au | 500 | 0.04 | ○ |
| 24 | Nb | 100 | Au | 520 | 0.04 | ☐ |
| 25 | Ta | 100 | Au | 200 | 0.15 | ○ |
| 26 | Mo | 100 | Au | 200 | 0.15 | ○ |
| 27 | W | 100 | Au | 200 | 0.15 | ○ |
| 28 | Ti | 100 | Au | 200 | 0.15 | ○ |

An n-type AuGeNi deposition layer was deposited on another part of a base material provided with the same deposition layers as those in the samples Nos. 14 and 20, and these layers were simultaneously heat-treated in the same atmosphere as the above. In this case, a normal n-type reaction layer was obtained with a uniform thickness substantially identical to that of the p-type reaction layer and contact resistivity at the level of $10^{-5}$ $\Omega cm^2$. When an ohmic electrode was prepared under the same conditions of metal layer deposition and heat treatment as the above except that the base material was prepared from $Ga_{0.15}In_{0.85}As_{0.33}P_{0.67}$ (x=0.15, y=0.33) i.e., a mixed crystal composition of InP and GaAs, in place of InP, contact resistivity at the level of $10^{-6}$ $\Omega cm^2$ was confirmed. Evaluation results substantially identical to those shown in Table 4 corresponding to the respective samples were obtained.

EXAMPLE 4

Figure 5:
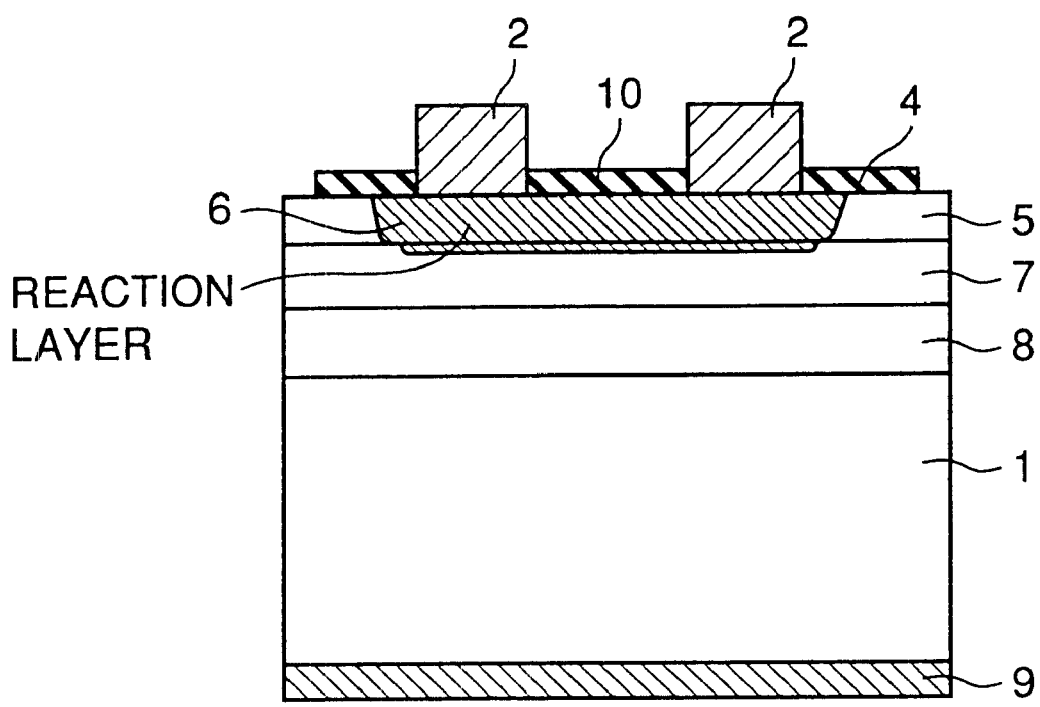
FIG. 5 illustrates a photodetector employing p-type ohmic electrodes according to the present invention.

The ohmic electrodes of the samples Nos. 1 and 12 in Examples 1 and 2 were employed for preparing a photodiode (InGaAs/InP photodiode) shown in FIG. 5. Referring to FIG. 5, the photodiode mainly has an InP base material 1, the inventive p-type ohmic electrodes 2, a passivation film 4, an InP window layer 5, a p-type semiconductor region 6, an InGaAs photoreceiving layer 7, an InP buffer layer 8 and an n-type ohmic electrode 9 prepared by forming an Au/Ge/Ni metal film on the base material 1. As shown in FIG. 5, this photodiode is formed by stacking the buffer layer 8 consisting of n-type InP, the photoreceiving layer 7 consisting of n-type InGaAs and the window layer 5 consisting of n-type InP on the n-type InP semiconductor base material 1. The p-type semiconductor region 6 is formed on a prescribed region in the window layer 5. The inventive p-type ohmic electrodes 2 are formed on the p-type semiconductor region 6, and the n-type ohmic electrode 9 is formed on the rear surface of the semiconductor base material 1. An antireflection film 10 and the passivation film 4 are formed on the inner and outer sides of the p-type ohmic electrodes 2 respectively. The aforementioned electrode of the inventive sample No. 26 is mounted on each p-type ohmic electrode 2.

This photodiode was subjected to a hot continuous energization test under a temperature of 200° C. with a bias voltage of −15 V, to recognize that the photodiode has high practical reliability superior to that of an AuZn ohmic electrode with no deterioration after 2000 hours.

As hereinabove described, the inventive p-type ohmic electrode can be provided on an InP based semiconductor base material at a heat treatment temperature of not more than 400° C. simultaneously with an n-type ohmic electrode. Further, the inventive ohmic electrode has small contact resistivity at the level of $10^{-5}$ $\Omega cm^2$ and the reaction layer thereof has a small uniform thickness of not more than 0.1 μm. Thus, it is possible to provide a metal electrode of an InP based semiconductor having remarkably higher practical reliability as compared with the conventional p-type ohmic electrode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an ohmic electrode consisting of a plurality of metal layers stacked on a base material consisting of a p-type group III–V semiconductor crystal, comprising steps of:

depositing a layer consisting of a group VB element as a first layer as viewed from the side of said base material and successively depositing a second layer and subsequent layer on said first layer thereby forming a laminate consisting of a plurality of metals; and heat-treating said laminate in the temperature range of 300 to 400° C.

2. The method of manufacturing an ohmic electrode according to claim 1, wherein said first layer contains at least one element selected from a group of Sb, Bi and As in said step of forming said laminate.

3. The method of manufacturing an ohmic electrode according to claim 1, wherein a layer containing Zn is deposited as said second layer on said first layer in said step of forming said laminate.

4. The method of manufacturing an ohmic electrode according to claim 3, wherein said second layer is prepared by depositing Zn and a transition metal in a stacked manner.

5. The method of manufacturing an ohmic electrode according to claim 3, wherein a third layer consisting of a refractory metal and a fourth layer consisting of Au are further deposited on said second layer in said step of forming said laminate.

6. The method of manufacturing an ohmic electrode according to claim 1, wherein said base material consists of either InP or $Ga_xIn_{1-x}As_yP_{1-y}$, where x and y represent zero or positive numbers less than 1 and y represents a number satisfying y=1−2.1x.

7. An ohmic electrode consisting of a plurality of metal layers stacked on a base material consisting of a p-type group III–V semiconductor crystal, wherein a first layer among said metal layers relatively closest to said base material consists of a group VB element, a second layer among said metal layers and a subsequent layer among said metal layers are successively stacked on said first layer, and said first layer has a thickness of 2 to 10 nm.

8. The ohmic electrode according to claim 7, wherein said first layer contains at least one element selected from a group of Sb, Bi and As.

9. A semiconductor device arrangement comprising a semiconductor device and the ohmic electrode according to claim 7 arranged on said device.

10. An ohmic electrode consisting of a plurality of metal layers stacked on a base material consisting of a p-type group III–V semiconductor crystal, wherein a first layer among said metal layers relatively closest to said base material consists of a group VB element, a second layer among said metal layers and a subsequent layer among said metal layers are successively stacked on said first layer, and said second layer contains Zn.

11. The ohmic electrode according to claim 10, wherein said second layer consists of Zn and a transition metal.

12. The ohmic electrode according to claim 10, wherein said first layer contains at least one element selected from a group of Sb, Bi and As.

13. A semiconductor device arrangement comprising a semiconductor device and the ohmic electrode according to claim 10 arranged on said device.

14. An ohmic electrode consisting of a plurality of metal layers stacked on a base material consisting of a p-type group III–V semiconductor crystal, wherein a first layer among said metal layers relatively closest to said base material consists of a group VB element, and wherein a second layer among said metal layers, a third layer among said metal layers consisting of a refractory metal, and a fourth layer among said metal layers consisting of Au are successively stacked on said first layer.

15. The ohmic electrode according to claim 14, wherein said third layer has a thickness in a range from 20 to 200 nm, and said fourth layer has a thickness in a range from 100 to 500 nm.

16. The ohmic electrode according to claim 14, wherein said first layer contains at least one element selected from a group of Sb, Bi and As.

17. A semiconductor device arrangement comprising a semiconductor device and the ohmic electrode according to claim 14 arranged on said device.

18. An ohmic electrode consisting of a plurality of metal layers stacked on a base material consisting of a p-type group III–V semiconductor crystal, wherein a first layer among said metal layers relatively closest to said base material consists of a group VB element, a second layer among said metal layers and a subsequent layer among said metal layers are successively stacked on said first layer, and said p-type group III–V semiconductor crystal consists of either InP or $Ga_xIn_{1-x}As_yP_{1-y}$, where x and y respectively represent zero or positive numbers less than 1, and where y represents a number satisfying y=1–2.1x.

19. The ohmic electrode according to claim 18, wherein said first layer contains at least one element selected from a group of Sb, Bi and As.

20. A semiconductor device arrangement comprising a semiconductor device and the ohmic electrode according to claim 18 arranged on said device.

* * * * *

UNITED STATES PATENT AND TRADEMARK OFFICE
CERTIFICATE OF CORRECTION

PATENT NO.    : 6,365,969 B1
DATED         : April 2, 2002
INVENTOR(S)   : Yamaguchi et al.

It is certified that error appears in the above-identified patent and that said Letters Patent is hereby corrected as shown below:

Title page,
Item [56], References Cited, OTHER PUBLICATIONS, after "Passivation of", replace "inP" by -- InP --
After "Formation of", replace "ohmis" by -- Ohmic --.

Column 9,
Table 2, under the headng "First Layer, Thickness (nm):
Line 1, replace "2" by -- 1 --.

Signed and Sealed this

Seventeenth Day of September, 2002

Attest:

JAMES E. ROGAN
*Attesting Officer*   *Director of the United States Patent and Trademark Office*